United States Patent
Krassnitzer et al.

(10) Patent No.: US 10,392,694 B2
(45) Date of Patent: Aug. 27, 2019

(54) HIGH-POWER PULSE COATING METHOD

(71) Applicant: Oerlikon Surface Solutions AG, Trubbach, Trubbach (CH)

(72) Inventors: Siegfried Krassnitzer, Feldkirch (AT); Denis Kurapov, Walenstradt (CH)

(73) Assignee: OERLIKON SURFACE SOLUTIONS AG, PFÄFFIKON, Pfäffikon, SZ (CH)

( * ) Notice: Subject to any disclaimer, the term of this patent is extended or adjusted under 35 U.S.C. 154(b) by 167 days.

(21) Appl. No.: 14/413,487

(22) PCT Filed: Jun. 29, 2013

(86) PCT No.: PCT/EP2013/001914
§ 371 (c)(1),
(2) Date: Jan. 8, 2015

(87) PCT Pub. No.: WO2014/008989
PCT Pub. Date: Jan. 16, 2014

(65) Prior Publication Data
US 2015/0122633 A1    May 7, 2015

(30) Foreign Application Priority Data
Jul. 10, 2012  (DE) .................. 10 2012 013 577

(51) Int. Cl.
*C23C 14/34* (2006.01)
*H01J 37/34* (2006.01)

(52) U.S. Cl.
CPC ........ *C23C 14/3485* (2013.01); *C23C 14/345* (2013.01); *C23C 14/3464* (2013.01);
(Continued)

(58) Field of Classification Search
CPC .............. C23C 14/3485; H01J 37/3467; H01J 37/3464
(Continued)

(56) References Cited

U.S. PATENT DOCUMENTS

2010/0108488 A1* 5/2010 Chen ................. B01J 21/063
  204/157.15
2010/0282598 A1* 11/2010 Ruske ................. C23C 14/0036
  204/192.13

FOREIGN PATENT DOCUMENTS

DE          601 04 709 T2      3/2005
DE     10 2006 061324 A1     12/2007
(Continued)

OTHER PUBLICATIONS

H. Klostermann, F. Fietzke, R. Labitzke, T. Modes, O. Zywitzki, Zr—Nb—N hard coatings deposited by high power pulsed sputtering using different pulse modes, Surface and Coatings Technology, vol. 204, Issues 6-7, Dec. 25, 2009, pp. 1076-1080, ISSN 0257-8972.*

(Continued)

*Primary Examiner* — Rodney G McDonald
(74) *Attorney, Agent, or Firm* — Pearne & Gordon LLP

(57) ABSTRACT

The invention relates to a method for determining the reactive gas consumption in a coating process using plasma, comprising the following steps: a) admitting reactive gas into a coating chamber, wherein the corresponding reactive gas flow is measured and, at the same time, the partial pressure prevailing in the coating chamber is measured, without igniting a plasma; b) admitting reactive gas into a coating chamber, wherein the corresponding reactive gas flow is measured and, at the same time, the partial pressure prevailing in the coating chamber is measured, wherein a plasma is ignited. The method is characterized in that—the steps a) and b) are carried out in the case of a plurality of different reactive gas flows and thus the partial pressure dependence of the reactive gas flow can be determined both with plasma or without plasma,—in the case of a given partial pressure, deduction of the reactive gas flow value that has been determined without plasma from the reactive gas (Continued)

flow value that has been determined with plasma and equating the difference to the reactive gas consumption.

7 Claims, 4 Drawing Sheets

(52) U.S. Cl.
CPC ...... *H01J 37/3405* (2013.01); *H01J 37/3467* (2013.01); *H01J 2237/332* (2013.01)

(58) Field of Classification Search
USPC ........................................ 204/192.13, 298.08
See application file for complete search history.

(56) References Cited

FOREIGN PATENT DOCUMENTS

| WO | 02/12584 A2 | 2/2002 |
|---|---|---|
| WO | 2011/138331 A2 | 11/2011 |

OTHER PUBLICATIONS

Lin, Jianliang, et al. "Recent advances in modulated pulsed power magnetron sputtering for surface engineering." JOM Journal of the Minerals, Metals and Materials Society 63.6 (2011): 48-58.*

Welzel, "Untersuchungen einer gepulsten Magnetronentladung bei der Abscheidung von Oxidschichten mittels optischer Emissionsspektroskipie und elektrischer Sonden", Diplomarbeit, Oct. 29, 2004, pp. 1-103.

International Search Report for PCT/EP2013/001853 dated Sep. 3, 2013.

Gudmundsson, et al., "High Power Impulse Magnetron Sputtering Discharge", Journal of Vacuum Science & Technology, Mar. 14, 2012, p. 030801.

Sproul, et al., "Control of Reactive Sputtering Processes", Thin Solid Films, Elsevier-Sequoia S.A., Lausanne, CH, vol. 491, No. 1-2, Nov. 22, 2005, pp. 1-17.

Sarakinos, et. al., "High Power Pulsed Magnetron Sputtering: A Review on Scientific and Engineering State of the Art", Surface and Coatings Technology, Elsevier, Amsterdam, NL, vol. 204, No. 11, Feb. 25, 2010, pp. 1661-1684.

* cited by examiner

HIGH-POWER PULSE COATING METHOD

The present invention relates to a method for applying a mixed crystal layer by means of High Power Impulse Sputtering (HIPIMS), using at least two targets with different materials.

When, in the state of the art, the targets for depositing the mixed crystal layer are operated simultaneously, the problem arises that, whilst the process parameters are the same, the different targets will be poisoned to a differently high degree. It is not possible in this context to keep both targets in the desired work mode independently from one another since the sputter sources are connected via the volume with the same partial pressure of the reactive gas.

In the framework of the present description, the expressions "spray coating" and "sputtering" are understood as being identical. In the framework of the present invention, the term "target" refers to that component part of a sputter source from which material is removed during the process.

In order to produce mixed crystals, composite targets (compound targets) are used in the sputtering technology according to the state of the art. A target is described in DE60104709 that consists of a first base material and of a second material that is integrated into the first base material in the form of fillers. A further method for producing compound targets is by pressing, in a powder-metallurgical process, two or several metallic powders with grain sizes below 100 μm.

One disadvantage in this respect is that to achieve different concentration ratios in the mixed crystal layer, other targets need to be used in each case. Additionally, the layer composition of layers in which target types of this kind are produced does not match the starting composition of the target material.

In the state of the art, another approach suggests simultaneously operating at least one material by means of dual magnetron or HIPIMS and at least a second material by means of arc evaporation. Accordingly, WO2011/138331 discloses a method for depositing mixed crystal layers with at least two different metals (M1, M2) on a substrate by means of PVD technique, characterized in that the deposition of the mixed crystal layer is performed by simultaneously using i) the cathode sputtering method of dual magnetron sputtering or High Power Impulse Magnetron Sputtering (HMS) and ii) arc evaporation (Arc-PVD).

The drawback of this is that because of the two PVD methods, two complex technologies must be implemented in one coating chamber. Furthermore, due to the arc evaporation process, the mixed crystal layer will see the formation of droplets that negatively affect the layer properties such as for example the layer roughness.

The task of the present invention consists in proposing a method with which the problems described above are overcome. In particular, it should be possible with the method to produce a mixed crystal layer by means of HIPIMS and without arc evaporation. According to the invention, this is achieved in that a HIPIMS method is performed using at least two targets with different materials, wherein the operating point suitable for the target material respectively is adjusted separately via the power pulse resp. the output and/or pulse duration.

For a better understanding of the complex processes of a HIPIMS method, the target poisoning will first be covered in a little more detail. The reactive sputter process is determined by the reaction of the target surface with the reactive gas such as for example nitrogen or oxygen. This is called target poisoning. When there is a high degree of poisoning of the target surface and a high reactivity (e.g. nitration or oxidation), this results in a low sputter rate. If in this case the sputter rate is plotted as a function of the reactive gas flow, it thus yields the hysteresis known to the one skilled in the art.

FIG. 1 shows the absorption of nitrogen at the reactive surfaces such as target and layer depending on the ratio of nitrogen flow to argon flow for different pulse durations. In this respect, the average pressure and the Ar flow were also held constant. The pulse power was 1000 W/cm$^2$. The solid line refers to a pulse duration of 50 μs and the dotted line relates to a pulse duration of 2000 μs.

The characteristic curve of a HIPIMS process with a pulse duration of 50 μs shows, when nitrogen is added, a complete utilization of the added nitrogen up to a N2/Ar—flow ratio of approx. 0.9. The nitrogen consumption is more or less proportional to the coating rate. From a ratio of 1.0 and higher, the sputter rate falls strongly due to the nitration of the target surface. This zone is called transition zone. It marks the area of transition to a poisoned target surface. A further addition of nitrogen will cause the target surface to become increasingly poisoned and the rate comes near a minimum value.

If the above-mentioned HIPIMS discharge is operated with a pulse duration of 2000 μs at the otherwise same average sputter power, the transition zone shifts to a poisoned target surface to higher N2/Ar flow ratios. This, however, means that at a specified N2/Ar flow ratio, it is possible by selecting the pulse duration to adjust whether the sputtering occurs with a target in metallic mode, in poisoned mode or in the transition zone. In other words, the operating point can be adjusted by means of selecting the pulse duration. This opens up the possibility, in the case of two or several targets with different materials and thus different response patterns vis-à-vis the sputter gas, to adjust a pulse duration associated with each target material at their operating point independently from one another.

It should be noted that when pulsing with moderate power densities, as used in the conventional sputtering process, the above-mentioned dependence on the pulse duration does not occur.

FIG. 1 shows in particular that when the operating point is specified with the ratio of reactive gas to inert gas being set at 1.2, the HIPIMS sputter process runs in the poisoned mode already when using a pulse duration of 50 μs and the coating rate is approx. 30% lower than the maximum achievable coating rate in the transition zone. By increasing the pulse duration of the HIPIMS power pulse whilst otherwise maintaining a constant average sputter power and the same process gas conditions, the operating point selected with a reactive gas to inert gas ratio of 1.2 will lie again in the transition zone.

The inventors conjecture that in the frame of the HIPIMS process the decisive role is played by the energy quantum per power pulse which results from the product of the pulse power amplitude and of the pulse duration. The number of pulses per time unit can also play a role in this respect.

The invention will now be described in detail on the basis of several embodiments by way of example and with the aids of the figures.

Figure 1:
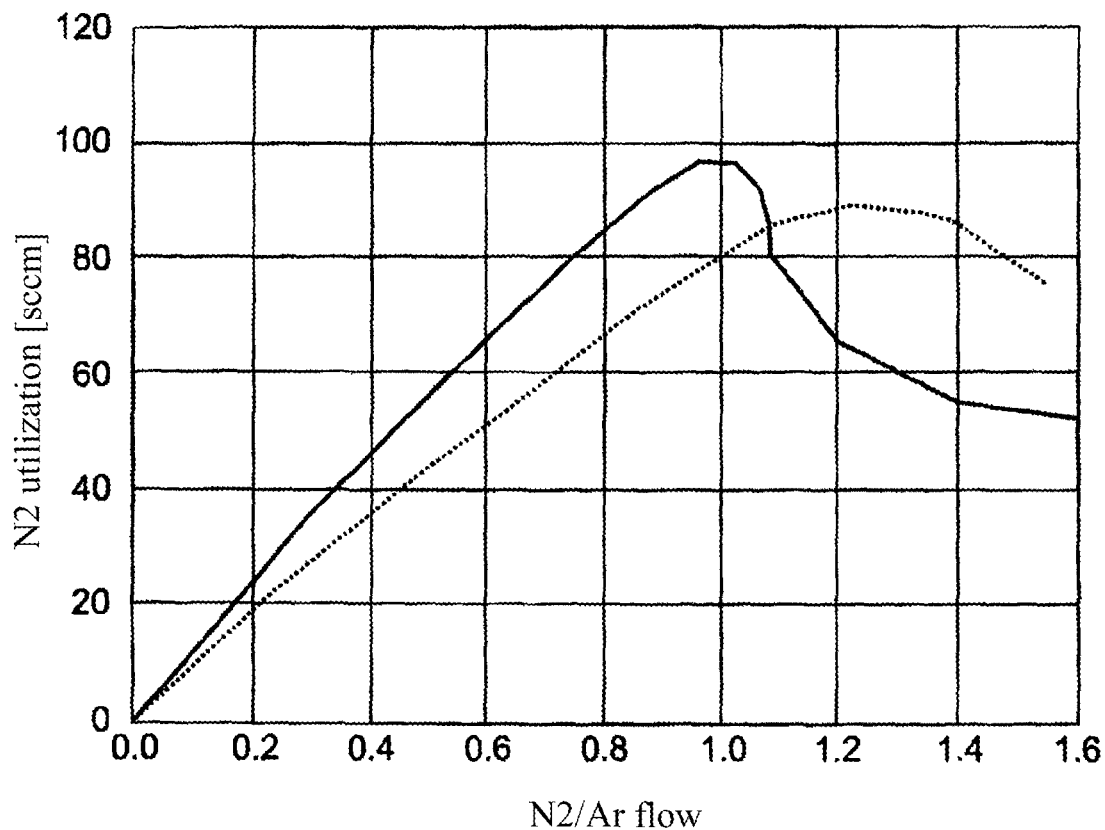
FIG. 1 shows the nitrogen utilization depending on the ratio of the reactive gas to inert gas flow for different pulse durations.

A coating chamber in which an inventive HIPIMS process is to be used comprises a first sputter source Q1 with a first target TA1 of a first target material to be sputtered and a second sputter source Q2 with a second target TA2 of a second target material. In the example, the first target TA1 can consist of aluminum and the second target TA2 of chromium. According to a first embodiment of the present invention, argon and nitrogen in a 1:1 ratio are let into the previously evacuated coating chamber. The target surfaces thus experience the same reactive and inert gas partial pressure. The power density applied at the targets in the pulses is set at 1000 W cm$^2$. The pulse durations (t1, t2) are set individually per target in such a manner that the respective operating point is in the transition zone. The fill factor D, i.e. the ratio between pulse duration and repeat interval (i.e. the time interval from the beginning of a pulse at one target until the beginning of the next pulse at the same target) is chosen to be the same for both targets. This thus results in a different average output being applied to the targets. The high power density will result in a high ionized proportion of the sputtered material. If a negative bias is applied to the substrates to be coated, this yields dense smooth layers.

According to a second embodiment of the present invention, by contrast to the first embodiment, the power densities applied at the targets and/or the fill factors are adjusted individually.

As is easily understood by the one skilled in the art, the possibility of providing pulses having a high power density with a prespecified pulse profile in a controlled manner plays an important role in the inventive method. If the power source allows it, the pulses can be applied at the targets in a completely independent manner from the respective other target. This is in particular the case if a separate power source is allocated to each target. In this respect, high-performance DC generators can be used that deliver their output at the respective associated target for the pulse duration and for the rest of the time supply their output to a so-called power drain (hereinafter called dummy load). Delivering the output to a dummy load makes sense especially at the beginning of the output discharge since the latter follows a buildup characteristic determined by the generator. Using several generators has the disadvantage that a large part of the output, namely the part that is channeled onto the dummy loads is simply not used.

According to a new method, it is possible to use in this connection a high-performance DC generator whose output is applied to the different targets by means of switches sequentially and preferably without interruption of the power delivery. At the end of the pulse interval, the power is then simply switched over onto the target. Again, it may be beneficial to also switch it at the beginning and/or intermittently onto a target replacement (dummy load). However, the loss of power at the dummy load, due to the fact that power is applied to several targets sequentially, is very much reduced.

Figure 2:
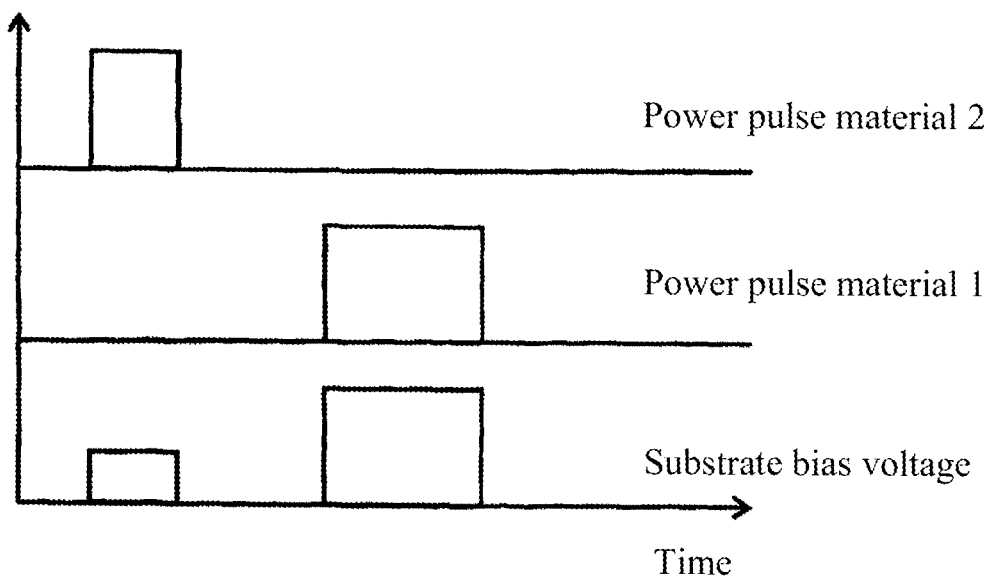
FIG. 2 shows the substrate bias synchronized onto the power pulse.

If power is applied to the targets sequentially with power pulses, there is the possibility according to a particularly preferred embodiment to synchronize the bias applied to the substrates with the pulse sequence and to individually apply a substrate voltage puke chosen specifically for a target and thus for a layer material. It is thus possible for example for another substrate bias voltage and thus acceleration of the ions to occur for target material 1 than for target material 2. The corresponding situation is represented in FIG. 2.

Figure 3:
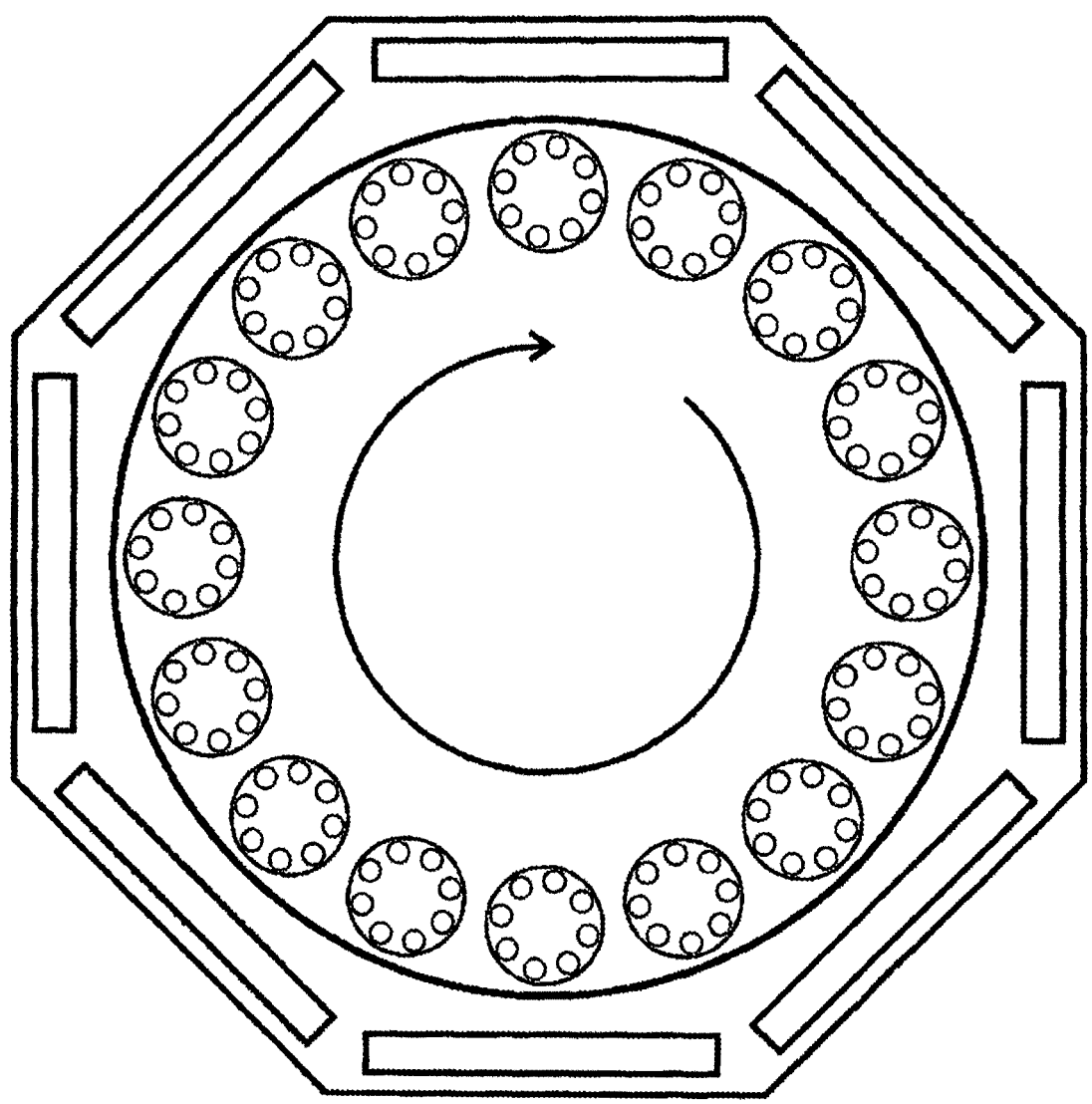
FIG. 3 shows diagrammatically a coating facility.

Coating facilities are often executed as batch systems in which the different coating sources are placed on the chamber walls. The substrates to be coated are then placed in a so-called carousel in workpiece holders and due to the rotation of the carousel are periodically brought past the coating sources. A corresponding situation is represented by way of example and schematically in FIG. 3. With such a structure it can happen that the layer thus generated is not deposited as a homogenous mixed crystal but so-called nano-layers are produced, wherein from one nano-layer to the neighboring one the layer composition changes. Since, as discussed above, the coating rate can be adjusted individually for each target by means of the pulse length, the thickness of the different nano-layers can be adjusted relatively to one another in a simple manner according to the invention.

According to a further embodiment of the present invention, the focus is directed even more towards the reactive gas consumption. According to the invention, the nitrogen partial pressure in the chamber is increased and, in the process, a measurement is made as to how strongly the nitrogen flow needs to be increased. This measurement is performed once without ignited plasma and once with ignited plasma.

Figure 4:
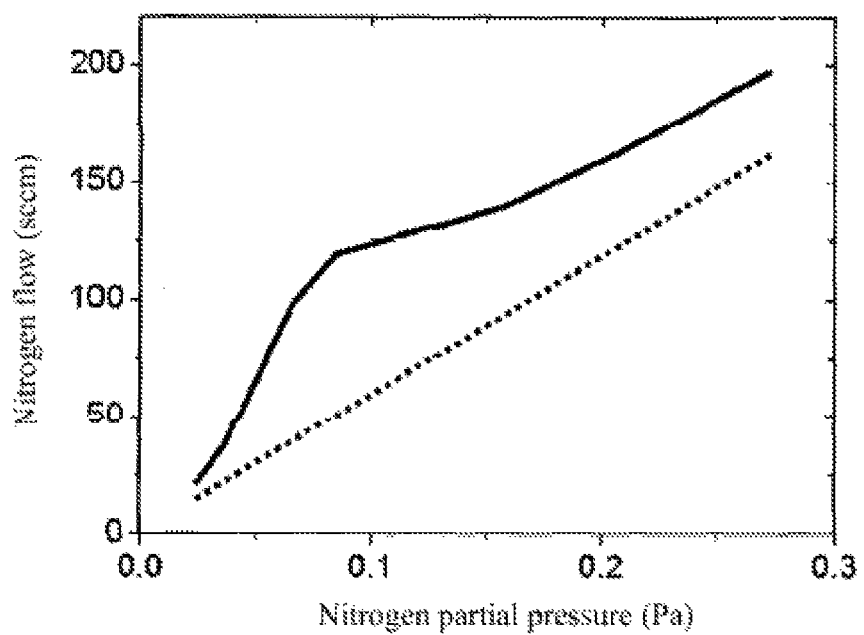
FIG. 4 shows the nitrogen flow depending on the partial pressure.

FIG. 4 represents accordingly the dependence of the nitrogen flow on the partial pressure in the chamber. In this respect, the dotted line relates to the dependence without ignited plasma, the solid line relates to the dependence with ignited plasma. In the present example, a pulse of 200 µs was chosen, with a power density in the pulse of 1000 W/cm$^2$.

Figure 5:
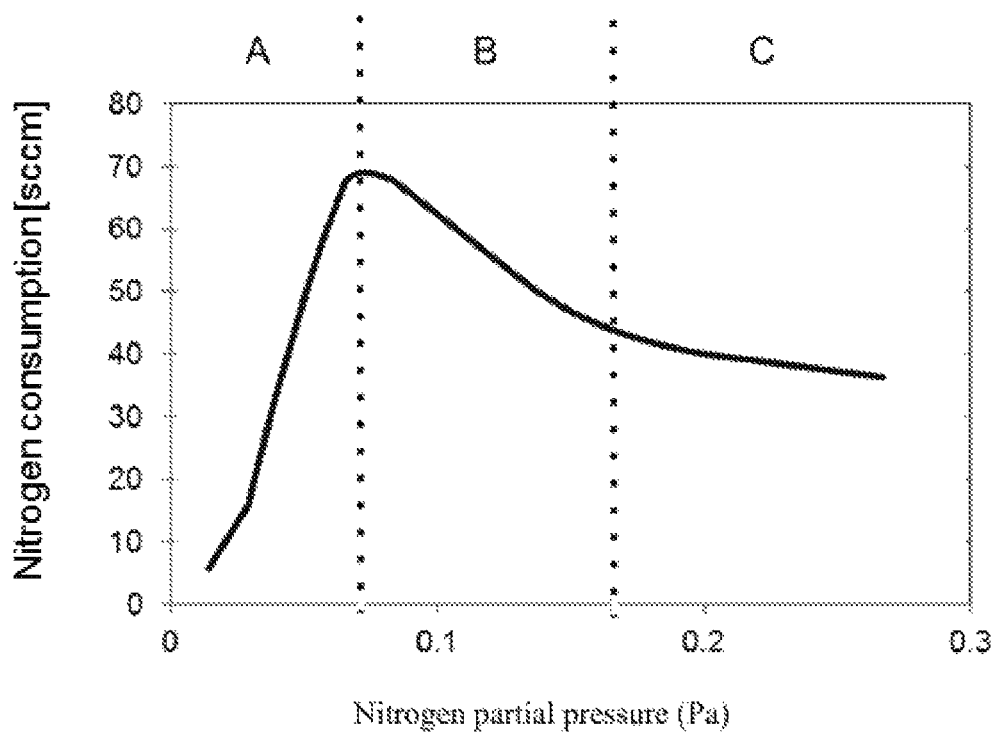
FIG. 5 shows the nitrogen consumption depending on the partial pressure.

If now the lower curve is deducted from the upper curve, this results in a measure for the nitrogen consumption depending on the nitrogen partial pressure. This is represented in FIG. 5. Also drawn are three zones, namely the metallic mode A, the transition mode B and the poisoned mode C. According to the invention, operations are carded out in the transition mode B. The partial pressure is accordingly set in a range whose lower limit leads to a maximum nitrogen consumption and whose upper limit yields 70% of the maximum nitrogen consumption.

Figure 6:
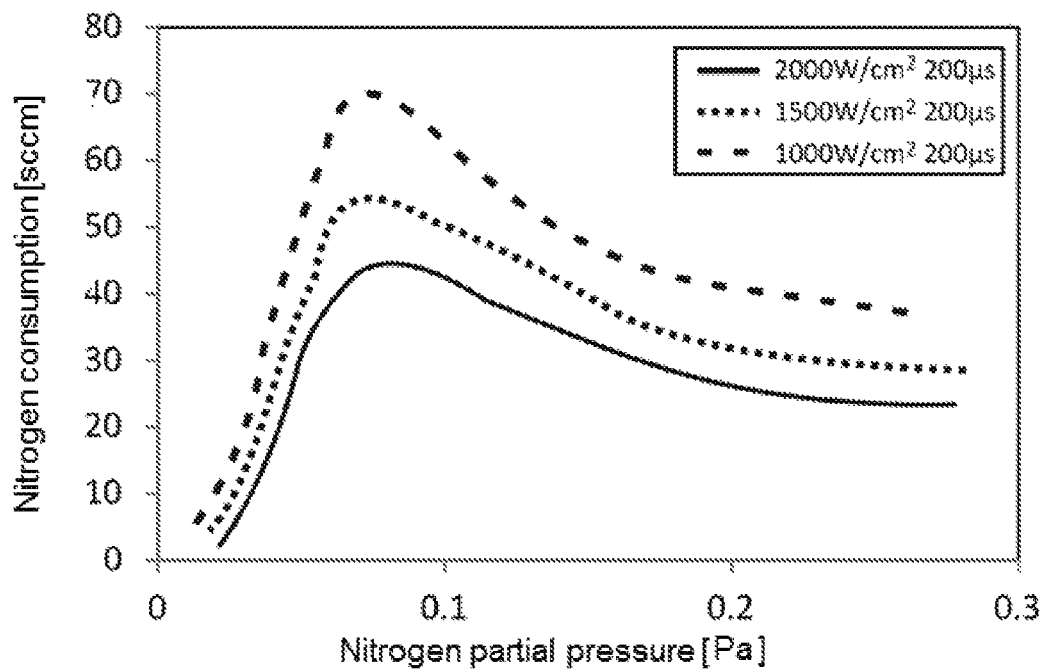
FIG. 6 shows the nitrogen consumption depending on the partial pressure for different pulse outputs.
Figure 7:
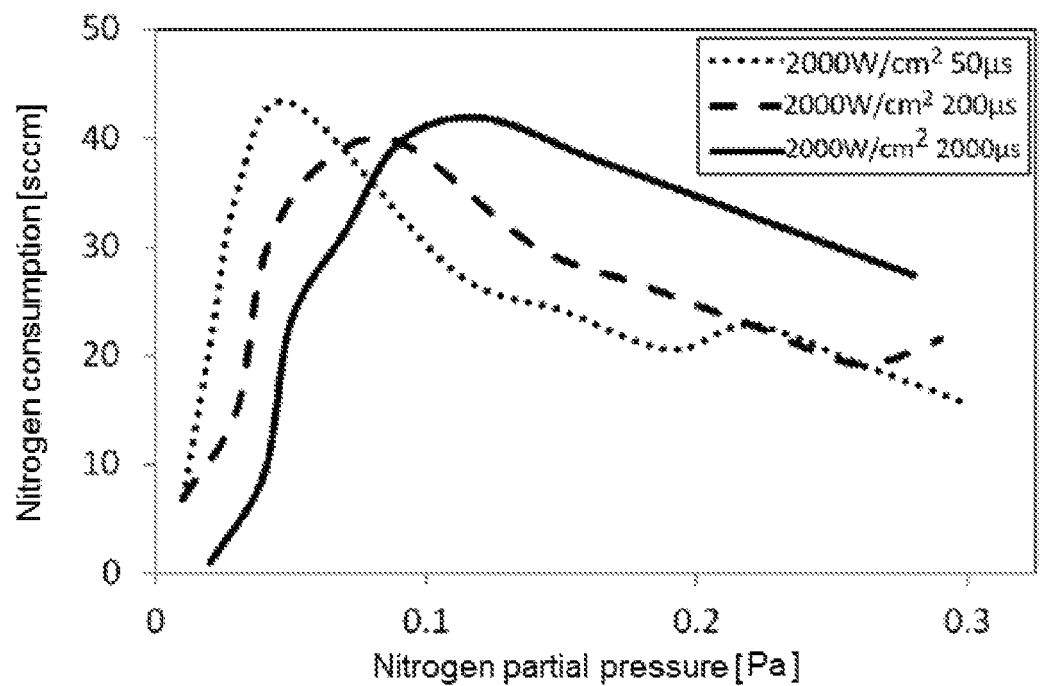
FIG. 7 shows the nitrogen consumption depending on the partial pressure for different pulse lengths.

The inventors have observed that the level of the maximum nitrogen consumption depends essentially on the power density in the pulse, as represented in FIG. 6, and the location of the maximum nitrogen consumption depends essentially on the pulse duration of the pulses, as represented in FIG. 7.

FIG. 6 shows that a higher power density in the pulse in the transition zone will yield a flattening of the dependence of the nitrogen consumption on the partial pressure. FIG. 7 shows that an increase of the pulse duration will result in the dependence becoming even flatter. In other words, when the pulse power is increased and/or the pulse duration is increased, the coating process becomes more stable since it is less dependent on the specific partial pressure.

A method has been disclosed for determining the reactive gas consumption in a coating process using plasma, comprising the following steps:

a) admitting reactive gas into a coating chamber, wherein the corresponding reactive gas flow is measured and, at the same time, the partial pressure prevailing in the coating chamber is measured, without igniting a plasma;

b) admitting reactive gas into a coating chamber, wherein the corresponding reactive gas flow is measured and, at the same time, the partial pressure prevailing in the coating chamber is measured, wherein a plasma is ignited; characterized in that the steps a) and b) are carried out in the case of a plurality of different reactive gas flows and thus the partial pressure dependence of the reactive gas flow can be determined both with plasma or without plasma, in the case of a given partial pressure, deduction of the reactive gas flow value that has been determined without plasma from the reactive gas flow value that has been determined with plasma and equating the difference to the reactive gas consumption.

In this respect, the "measurement of the partial pressure" can be achieved for example indirectly in that the total pressure prevailing in the coating chamber is measured and the partial pressure of the working gas is then deducted from it.

Furthermore, a method has been described for coating substrates by means of a reactive plasma-assisted HIPIMS sputter process, wherein first the reactive gas consumption depending on one or several coating parameters is determined and the coating parameters for the coating process are selected such that the coating takes place in the transition mode.

The method can be characterized in that the above-mentioned method is used for determining the reactive gas consumption.

The invention claimed is:

1. Method for coating a substrate comprising the steps of:
    determining a reactive gas consumption depending on at least one coating parameter;
    selecting said at least one coating parameter for a coating process such that a coating takes place in a transition mode;
    coating the substrate by applying a mixed crystal layer, using at least two targets made of different materials, by means of a reactive plasma-assisted sputter process with a pulse power density between 1000 W/cm$^2$ and 2000 W/cm$^2$ and a pulse duration between 200 µs and 200 µs by using a reactive gas partial pressure as a first coating parameter;
    setting the reactive gas partial pressure in a range starting from a point at which the reactive gas consumption falls from a maximum reactive gas consumption and ending at a point at which the reactive gas consumption is 70% of the maximum reactive gas consumption; and
    regulating the reactive gas consumption in such a way that the reactive gas consumption is at least at 70% of a maximum reactive gas consumption by adjusting the reactive gas partial pressure.

2. Method according to claim 1, further comprising the steps of:
    coating the substrate by using the pulse power density as a second coating parameter; and
    adjusting the pulse power density between 1000 W/cm$^2$ and 2000 W/cm$^2$ so that the dependence of the reactive gas consumption on the reactive gas partial pressure is reduced in such a manner that the coating process becomes more stable than a process which is accomplished at a lower pulse power.

3. Method according to claim 1, further comprising the steps of;
    coating the substrate by using the pulse duration as a third coating parameter; and
    adjusting the pulse duration between 200 µs and 2000 µs so that the dependence of the reactive gas consumption on the reactive gas partial pressure is reduced in such a manner that the coating process becomes more stable than a process which is accomplished at a lower pulse duration.

4. Method according to claim 1, wherein the step of determining the reactive gas consumption depending on the at least one coating parameter comprises the steps of:
    a) admitting reactive gas into a coating chamber, wherein a corresponding reactive gas flow is measured and, at the same time, the reactive gas partial pressure prevailing in the coating chamber is measured, without igniting a plasma;
    b) admitting reactive gas into the coating chamber, wherein the corresponding reactive gas flow is measured and, at the same time, the reactive gas partial pressure prevailing in the coating chamber is measured, wherein a plasma is ignited;
    c) repeating the steps a) and b) in the case of a plurality of different reactive gas flows and determining the partial pressure dependence of the reactive gas flow both with plasma or without plasma, and
    d) in the case of a given partial pressure, deducting of the reactive gas flow value that has been determined without plasma from the reactive gas flow value that has been determined with plasma and equating the difference to the reactive gas consumption.

5. Method according to claim 1, characterized in that nitrogen gas is used as reactive gas.

6. Method for coating a substrate comprising the steps of:
    determining a correlation between reactive gas consumption and one coating parameter, wherein the one coating parameter is a reactive gas partial pressure;
    coating the substrate by applying a mixed crystal layer, using at least two targets made of different materials, by means of a reactive plasma-assisted sputter process with a pulse power density between 1000 W/cm$^2$ and 2000 W/cm$^2$ and a pulse duration between 200 µs and 2000 µs by using the reactive gas partial pressure,
    wherein the reactive gas partial pressure is set in a range starting from a point at which the reactive gas consumption falls from a maximum reactive gas consumption and ending at a point at which the reactive gas consumption is 70% of the maximum reactive gas consumption according to the previously determined correlation; and
    adjusting the reactive gas partial pressure in such a way that the reactive gas partial pressure is at least at 70% of the maximum reactive gas consumption according to the previously determined correlation between the reactive gas partial pressure and the reactive gas consumption.

7. Method according to claim 1, wherein one of the at least two targets comprises aluminum and the other target comprises chromium.

* * * * *

UNITED STATES PATENT AND TRADEMARK OFFICE
CERTIFICATE OF CORRECTION

PATENT NO. : 10,392,694 B2
APPLICATION NO. : 14/413487
DATED : August 27, 2019
INVENTOR(S) : Siegfried Krassnitzer et al.

Page 1 of 1

It is certified that error appears in the above-identified patent and that said Letters Patent is hereby corrected as shown below:

In the Specification

Column 4, Line 1, "voltage puke" should be -- voltage pulse --.

Column 4, Line 40, "carded" should be -- carried --.

Signed and Sealed this
Nineteenth Day of November, 2019

Andrei Iancu
*Director of the United States Patent and Trademark Office*